United States Patent
Sekiya et al.

(10) Patent No.: US 7,322,368 B2
(45) Date of Patent: Jan. 29, 2008

(54) PLASMA CLEANING GAS AND PLASMA CLEANING METHOD

(76) Inventors: Akira Sekiya, c/o National Institute of Advanced Industrial Science and Tech., 1-1-1, Higashi, Tsukuba-shi, Ibaraki (JP) 305-8565; Yuki Mitsui, c/o Research Institute of Innovative Tech. for the Earth, 11-6, Nishi-Shimbashi 2-chome, Minato-ku, Tokyo (JP) 105-0003; Yutaka Ohira, c/o Research Institute of Innovative Tech. for the Earth, 11-6, Nishi-Shimbashi 2-chome, Minato-ku, Tokyo (JP) 105-0003; Taisuke Yonemura, c/o Research Institute of Innovative Tech. for the Earth, 11-6, Nishi-Shimbashi 2-chome, Minato-ku, Tokyo (JP) 105-0003

(*) Notice: Subject to any disclaimer, the term of this patent is extended or adjusted under 35 U.S.C. 154(b) by 335 days.

(21) Appl. No.: 10/415,101

(22) PCT Filed: Aug. 26, 2002

(86) PCT No.: PCT/JP02/08566

§ 371 (c)(1),
(2), (4) Date: Apr. 30, 2003

(87) PCT Pub. No.: WO03/021653

PCT Pub. Date: Mar. 13, 2003

(65) Prior Publication Data

US 2004/0016441 A1    Jan. 29, 2004

(30) Foreign Application Priority Data

Aug. 30, 2001    (JP) ............................. 2001-261484

(51) Int. Cl.
B08B 9/093    (2006.01)
B08B 9/00    (2006.01)
B08B 6/00    (2006.01)
B44C 1/22    (2006.01)
C03C 15/00    (2006.01)
C03C 25/68    (2006.01)
C23F 1/00    (2006.01)

(52) U.S. Cl. .................... 134/1.1; 134/22.1; 134/22.18; 134/34; 216/63; 216/67; 216/69; 438/905

(58) Field of Classification Search ................. 134/1.1, 134/22.1, 22.18, 34; 216/63, 67, 69; 438/905
See application file for complete search history.

(56) References Cited

U.S. PATENT DOCUMENTS 5,425,842 A    6/1995    Zijlstra (Continued)

FOREIGN PATENT DOCUMENTS

EP    1138802    10/2001

(Continued)

*Primary Examiner*—Michael Barr
*Assistant Examiner*—Rita R Patel
(74) *Attorney, Agent, or Firm*—Oblon, Spivak, McClelland, Maier & Neustadt, P.C.

(57) ABSTRACT

A plasma cleaning gas for CVD chamber is a gas for cleaning silicon-containing deposits on the surface of a CVD chamber inner wall and the surfaces of members placed inside the CVD chamber after film forming treatment on a substrate by a plasma CVD apparatus. The cleaning gas includes 100% by volume of fluorine gas which gas can generate plasma by electric discharge. When 100% by volume of fluorine gas is plasma-generated by electric discharge and then used as a cleaning gas, an extremely excellent etching rate can be attained and further plasma can be stably generated even in the total gas flow rate of 1000 sccm and at a chamber pressure of 400 Pa. Further, the uniformity of cleaning can be also ensured in the above conditions. Additionally the fluorine gas concentration is 100% so that the apparatus is not complicated and thereby the cleaning gas has excellent practicability.

6 Claims, 1 Drawing Sheet

U.S. PATENT DOCUMENTS

| | | | | |
|---|---|---|---|---|
| 5,632,821 | A * | 5/1997 | Doi | 134/1.1 |
| 5,716,495 | A * | 2/1998 | Butterbaugh et al. | 438/708 |
| 6,569,257 | B1 * | 5/2003 | Nguyen et al. | 134/26 |
| 6,843,258 | B2 * | 1/2005 | Shang et al. | 134/22.1 |
| 6,880,561 | B2 * | 4/2005 | Goto et al. | 134/22.1 |
| 2001/0008138 | A1 | 7/2001 | Demos et al. | |
| 2003/0010354 | A1 * | 1/2003 | Goto et al. | 134/1.1 |

FOREIGN PATENT DOCUMENTS

| | | |
|---|---|---|
| JP | 3-44469 | 2/1991 |
| JP | 3-293726 | 12/1991 |
| JP | 9-251971 | 9/1997 |
| JP | 10-12593 | 1/1998 |
| JP | 10012593 | 1/1998 |
| JP | 10-72672 | 3/1998 |
| JP | 10072672 | 3/1998 |
| JP | 2002-198357 | 7/2002 |
| JP | 2002-212732 | 7/2002 |
| WO | WO 01/98555 A1 | 12/2001 |

* cited by examiner

Fig. 1

PLASMA CLEANING GAS AND PLASMA CLEANING METHOD

FIELD OF THE INVENTION

The present invention relates to plasma cleaning gases for CVD chambers, which gases are used in order to remove deposits on the inner wall surface or other surfaces of CVD chambers during film forming treatment in plasma CVD (Chemical Vapor Deposition) apparatus in which the film forming treatment with silicon oxide, silicon nitride etc. is conducted on the substrate surfaces for semiconductors etc., and further relates to processes for plasma cleaning of the CVD chambers.

More particularly, it relates to plasma cleaning gases for CVD chambers which gases have high uniformity of cleaning deposits on the inner wall, etc. and an excellent etching rate, and relates to processes for plasma cleaning of the CVD chambers. The term "uniformity of cleaning" used herein is an indication of stability of generated plasma and is evaluated in the following manner, as also described in the examples. A wafer previously deposited with $SiO_2$ film by CVD is used as a sample and is placed on the lower electrode, and then the etching rate is measured. The evaluation of the uniformity of the etching rate on the inside of the wafer surface is taken as a typical evaluation of uniformity of cleaning. This property is evaluated likewise hereinafter.

The term "etching rate" used herein is an indication of evaluating the rate of cleaning and is evaluated by measuring the rate of etching a $SiO_2$ thin film on a wafer as described in the examples. The etching rate is taken as a typical evaluation of cleaning. The property is evaluated likewise hereinafter.

BACKGROUND OF THE INVENTION

Conventionally, in plasma CVD apparatus used in processes of producing semiconductors such as LSI, etc., large amounts of perfluoro compounds such as $CF_4$, $C_2F_6$, $SF_6$, $NF_3$ etc. are used as a cleaning gas for CVD chambers in order to remove deposits on the surface of the inner wall or other surfaces of the CVD chambers during film forming treatment. These compounds are stable, and have a very long life in the atmosphere and a high infrared absorption. With regard to global warming potential ($GWP_{100}$) of the above perfluoro compounds, on the basis of carbon dioxide being 1, $CF_4$ has 6500, $C_2F_6$ has 9200, $SF_6$ has 23900 and $NF_3$ has 8000 which values are extremely high. Therefore, the compounds have a high greenhouse effect and affect global warming very greatly.

Further, in the case of using the perfluoro compounds such as $CF_4$, $C_2F_6$, $SF_6$, $NF_3$ etc. as a plasma CVD chamber cleaning gas, exhaust gases include the perfluoro compounds themselves which compounds are not decomposed even if plasma is generated. Further, in the case of using various compounds containing carbon and fluorine such as perfluoro carbon, hydrofluoro carbon (HFC) etc., exhaust gases contain $CF_4$, etc. which are generated as a by-product. So they induce an environmental problem of exhausting global warming gases.

The gases inviting the greenhouse effect and global warming gas contained in the exhaust gases as described above are hardly absorbed or decomposed by abatement apparatus (water scrubber) which apparatus has conventionally been used mainly, so that a decomposition apparatus by chemical reactions including burning with high temperature and high energy is required.

Further, in the case that these cleaning gases are used for plasma CVD chambers cleaning, a method that the cleaning gases are generated by plasma for cleaning has been attempted for attaining effective cleaning performance.

Usually, in plasma cleaning, a proper amount of an additional gas such as oxygen, argon etc. is mixed with the cleaning gases.

According to the knowledge of the present inventors, in the mixed gas system of the cleaning gases and the additional gases, with increasing the concentrations of the cleaning gases in conditions that the total gas flow rates are constant, the etching rates tend to be increased. However, when the cleaning gas concentrations are over constant concentrations, there are problems such as instability in plasma generation, slowdown or lowering of the etching rate, deterioration in uniformity of cleaning etc. Particularly, using the cleaning gas in a concentration of 100% induces a more marked tendency toward instability in plasma generation, slowdown or lowering of the etching rate and deterioration in the uniformity of cleaning so that it has a problem such that it is lacking in practical use.

On this account, prior to use, the cleaning gases need to be diluted so as to have the peak concentration in the etching rate-cleaning gas concentration curve or a lower concentration than the peak concentration. In order to depress the lowering of the etching rate caused with the dilution, the cleaning condition has been optimized by increasing the chamber pressure or increasing the gas flow rate in cleaning. However, when the chamber pressure is enhanced or the gas flow rate is increased in cleaning, the plasma generation becomes unstable, so that the uniformity of cleaning is deteriorated and efficient cleaning cannot be conducted.

Of the above cleaning gases, for example, in the use of $NF_3$, a remote plasma apparatus in which plasma is generated other than a process chamber of a CVD apparatus is required for securing a high decomposition rate which is one of the objects so that the cleaning efficiency is improved, contamination of undecomposed $NF_3$ into exhaust gases is avoided. However, the CVD apparatus provided with the remote plasma apparatus has a problem in that the apparatus is complicated and thereby the production cost is high.

Further, in conventionally used cleaning gases, when the chamber pressure is enhanced or the gas flow rate is increased, the decomposition rate of the cleaning gases in plasma and the plasma stability (uniformity of cleaning) are remarkably decreased so that the cleaning gases themselves are contained in the exhaust gases resulting in increasing the emission amount of global warming substances. Therefore, it is necessary to take measures for abatement of the gases.

Accordingly, plasma cleaning gases which are used for chamber cleaning after the CVD process in producing semiconductors such as LSI, etc., and have a low greenhouse effect and a low global warming potential, excellent uniformity of cleaning even in diluting conditions or not, and also have an effective etching rate, and a process for plasma cleaning has been desired.

In the light of the foregoing, the present inventors have earnestly studied for solving the above problems, and found that when a mixed gas of fluorine gas and a gas incapable of substantially reacting with fluorine in plasma is used, plasma can be generated stably without a remote plasma apparatus in wider conditions than the use of, for example, $NF_3$ and further the excellent etching rate can be provided without lowering of the etching rate. The present inventors further found that for example, as will be described in Examples 34 and 37, and Comparative Examples 30 and 31 of the present specification, in the case that the total gas flow rate is 1000 sccm, when the chamber pressure condition is changed from 250 Pa to a higher pressure of 400 Pa, in the use of a mixed gas containing 20% by volume of $NF_3$, the uniformity of cleaning is decreased, but in the use of a mixed gas containing the same 20% by volume of fluorine gas, the proper uniformity of cleaning can be secured.

Further, the present inventors found that when 100% by volume of fluorine gas is generated by plasma and then is used as a cleaning gas, the extremely excellent etching rate can be attained without the use of a remote plasma apparatus, and also even in conditions that the total gas flow rate is about 1000 sccm and the chamber pressure is about 400 Pa, plasma can stably be generated and the proper uniformity of cleaning can be secured.

Thus, the present invention has been accomplished.

The present invention is intended to solve the problems associated with the prior arts as described above, it is an object of the present invention to provide a plasma cleaning gas for CVD chambers which gas has excellent uniformity of cleaning and an effective etching rate in cleaning in the conditions that the total gas flow rate is about 1000 sccm and the chamber pressure is about 400 Pa under the dilution condition or under no dilution condition. It is a further object of the invention to provide a process for plasma cleaning CVD chambers.

DISCLOSURE OF THE INVENTION

The first plasma cleaning gas for CVD chambers according to the present invention comprises 100% by volume of fluorine gas capable of generating plasma by electric discharge and is used for cleaning silicon-containing deposits on the surface of a CVD chamber inner wall and the surfaces of members placed inside the CVD chamber after film forming treatment on a substrate by a plasma CVD apparatus.

The first process of plasma cleaning for CVD chambers according to the present invention comprises cleaning silicon-containing deposits on the surface of a CVD chamber inner wall and the surfaces of members placed inside the CVD chamber by plasma generated from 100% by volume of fluorine gas by electric discharge, after film forming treatment on a substrate in a plasma CVD apparatus.

The silicon-containing deposits preferably comprise at least one selected from:
(1) silicon,
(2) a compound comprising silicon and at least one of oxygen, nitrogen, fluorine and carbon, and
(3) a compound of a high melting point-having metal silicide.

The chamber pressure in the plasma CVD apparatus is preferably from 50 Pa to 1000 Pa, and the flow rate of fluorine gas introducing into a plasma generating part is preferably from 50 sccm to 1000 sccm in the cleaning.

The plasma generation from the above-described fluorine gas is preferably conducted by electric discharge in a process chamber of the plasma CVD apparatus whereinto fluorine gas has been introduced.

The second plasma cleaning gas for CVD chambers according to the present invention comprises fluorine gas capable of generating plasma by electric discharge and a gas substantially incapable of reacting with fluorine in plasma, and is used for cleaning silicon-containing deposits on the surface of a CVD chamber inner wall and the surfaces of members placed inside the CVD chamber after film forming treatment on a substrate by a plasma CVD apparatus.

It is preferred that the concentration of the fluorine gas capable of generating plasma by electric discharge be more than 20% by volume to less than 100% by volume and the concentration of the gas substantially incapable of reacting with fluorine in plasma be more than 0% by volume to not more than 80% by volume provided that the total concentration of the fluorine gas capable of generating plasma by electric discharge and the gas substantially incapable of reacting with fluorine is 100% by volume.

Further, it is more preferred that the concentration of the fluorine gas capable of generating plasma by electric discharge be more than 30% by volume to less than 100% by volume and the concentration of the gas substantially incapable of reacting with fluorine in plasma be more than 0% by volume to not more than 70% by volume provided that the total concentration of the fluorine gas capable of generating plasma by electric discharge and the gas substantially incapable of reacting with fluorine in plasma is 100% by volume.

The gas substantially incapable of reacting with fluorine in plasma is preferably at least one selected from the group of nitrogen, oxygen, carbon dioxide, $N_2O$, dried air, argon, helium and neon.

The second process of plasma cleaning for CVD chambers according to the present invention comprises cleaning silicon-containing deposits on the surface of a CVD chamber inner wall and the surfaces of members placed inside the CVD chamber using a cleaning gas for plasma CVD chambers comprising fluorine gas capable of generating plasma by electric discharge and a gas substantially incapable of reacting with fluorine in plasma after film forming treatment on a substrate by means of a plasma CVD apparatus.

It is preferred that the concentration of the fluorine gas capable of generating plasma by electric discharge be more than 20% by volume to less than 100% by volume and the concentration of the gas substantially incapable of reacting with fluorine in plasma be more than 0% by volume to not more than 80% by volume provided that the total concentration of the fluorine gas capable of generating plasma by electric discharge and the gas substantially incapable of reacting with fluorine is 100% by volume.

The pressure in the chamber is preferably from 50 Pa to 1000 Pa, and the flow rate of fluorine gas is preferably from 50 sccm to 1000 sccm in the cleaning.

The plasma generation from fluorine gas is preferably conducted by electric discharge in a process chamber of the plasma CVD apparatus whereinto fluorine gas has been introduced.

PREFERRED EMBODIMENTS OF THE INVENTION

The present invention will be described in detail hereinafter.

(Plasma Cleaning Gas for CVD Chambers and Process of Plasma Cleaning According to the First Invention)

The plasma cleaning gas for CVD chambers according to the first invention is used for cleaning silicon-containing deposits on the surface of a CVD chamber inner wall and the surfaces of members placed inside the CVD chamber after film forming treatment on a substrate by a plasma CVD apparatus. The cleaning gas comprises 100% by volume of fluorine gas and generates plasma from fluorine gas by electric discharge to remove the silicon-containing deposits as described above.

The first process of plasma cleaning for CVD chambers according to the invention comprises cleaning, by plasma generated from 100% by volume of fluorine gas by electric discharge, silicon-containing deposits on the surface of a CVD chamber inner wall and the surfaces of members placed inside the CVD chamber after film forming treatment on a substrate by means of a plasma CVD apparatus.

The term "plasma cleaning for CVD chambers" used in the present specification means removing deposits on the surface of a chamber inner wall and the surfaces of members such as jigs, piping or other inside components placed in semiconductor producing apparatus, for example, CVD apparatus or the like after the CVD process in a production process of semiconductors such as LSI, etc.

Further, the term "plasma generation" used in the present specification means that plasma is generated by introducing fluorine gas or the mixed gas of fluorine gas and the gas substantially incapable of reacting with fluorine in plasma and electrically discharging at a plasma generating part (CVD chamber or remote plasma apparatus).

The targeted compound of the CVD chamber cleaning with such 100% by volume of fluorine gas may include the above described silicon-containing deposits on the surfaces of the inner wall of CVD chambers and jigs or the like of CVD apparatus in the CVD method, etc. The silicon-containing deposits comprise, for example, at least one selected from:

(1) silicon,
(2) a compound comprising silicon and at least one of oxygen, nitrogen, fluorine and carbon, and
(3) a compound of a high melting point-having metal silicide. Specific examples thereof are Si, $SiO_2$, $Si_3N_4$, and high melting point-having metal silicides such as WSi.

In the process of plasma cleaning for CVD chambers according to the invention, the plasma generation from fluorine gas by electric discharge may be conducted in a remote chamber or in a process chamber of a plasma CVD apparatus whereinto fluorine gas is introduced without using the remote chamber.

Of these, it is desired to generate plasma from fluorine gas in the process chamber of the plasma CVD apparatus.

When plasma is generated from fluorine gas in the process chamber, the cleaning treatment of deposits in the CVD chamber can be conducted efficiently for a short time, and also plasma can be stably generated. Further, the apparatus can be compacted so that it is practical as compared with the plasma generation in the remote chamber.

The first cleaning gas of the invention comprises 100% by volume of fluorine gas and is used for plasma cleaning for CVD chambers. Usually, in the case that $C_2F_6$ or $NF_3$ is used as a cleaning gas, 100% by volume of the gas is not used, and it is necessary to mix the gas with a diluting gas such as oxygen, argon, nitrogen etc. for use. Depending to the conditions, in the case of $C_2F_6$ or $NF_3$, when the $C_2F_6$ or $NF_3$ concentration in the cleaning gas is more than about 20 to 40% by volume, the rise of the etching rate based on the concentration in the cleaning gas, in a constant total gas flow rate, is slowed down and the etching rate is lowered finally. In the case that the total gas flow rate is 1000 sccm and the chamber pressure is about 400 Pa as described above, these gases cannot generate plasma stably. When the gas concentration or the chamber pressure is increased, the uniformity of cleaning becomes worse.

However, in the plasma cleaning gas and the process of plasma cleaning for CVD chambers according to the first or second invention, fluorine gas is used and the cleaning gas has a specific characteristic such that the etching rate is increased almost linearly with the increase of the concentration of fluorine gas in the condition that the total gas flow rate is constant. Even if the cleaning gas comprises 100% by volume of fluorine gas, the extremely excellent etching rate can be attained and also the uniformity of cleaning is extremely excellent.

When 100% by volume of fluorine gas is used, plasma can be stably generated, not only in the case that the chamber pressure is 150 Pa (flow rate 150 sccm) but also in the case that the chamber pressure is 250 Pa (flow rate 300 sccm). The cleaning gas having the specific characteristic as above has not been found out previously so long as the present inventors have investigated.

When the cleaning is conducted with the plasma cleaning gas according to the first invention, the chamber pressure is preferably from 50 Pa to 1000 Pa, more preferably from 150 Pa to 1000 Pa. The fluorine gas flow rate is preferably from 50 sccm to 1000 sccm, more preferably 150 to 1000 sccm.

When the chamber pressure and the fluorine gas flow rate are in the above ranges, the excellent etching rate can be attained, and the stabilization of plasma generation and the uniformity of cleaning can be kept excellent.

The chamber pressure is an inner pressure of a process chamber in a CVD apparatus and, in general, is automatically regulated by setting.

(Plasma Cleaning Gas for CVD Chambers and Process of Plasma Cleaning According to the Second Invention)

The plasma cleaning gas for CVD chambers according to the second invention is used for cleaning silicon-containing deposits on the surface of a CVD chamber inner wall and the surfaces of members placed inside the CVD chamber after film forming treatment on a substrate by a plasma CVD apparatus. The plasma cleaning gas comprises fluorine gas capable of generating plasma by electric discharge and a gas substantially incapable of reacting with fluorine in plasma.

The second process of plasma cleaning for CVD chambers according to the invention comprises cleaning silicon-containing deposits on the surface of a CVD chamber inner wall and the surfaces of members placed inside the CVD chamber by plasma generated from fluorine gas by electric discharge using the plasma cleaning gas for CVD chambers composed of fluorine gas capable of generating plasma by electric discharge and the gas substantially incapable of reacting with fluorine in plasma, after film forming treatment on a substrate by means of a plasma CVD apparatus.

In the present specification, "fluorine" contained in the gas substantially incapable of reacting with fluorine includes fluorine molecules, fluorine atoms, fluorine radicals, fluorine ions etc.

The concentration of the fluorine gas capable of generating plasma by electric discharge is preferably more than 20% by volume to less than 100% by volume, and the concentration of the gas substantially incapable of reacting with fluorine in plasma is preferably more than 0% by volume to not less than 80% by volume. The sum of the concentration of the fluorine gas capable of generating plasma by electric discharge and the concentration of the gas substantially incapable of reacting with fluorine in plasma is 100% by volume.

The concentration of the fluorine gas capable of generating plasma by electric discharge is, further, preferably more than 30% by volume to less than 100% by volume, more preferably not less than 40% by volume to less than 100% by volume, and especially not less than 70% by volume to less than 100% by volume, and the concentration of the gas substantially incapable of reacting with fluorine in plasma is, further, preferably more than 0% by volume to not more than 70% by volume, more preferably more than 0% by volume to less than 60% by volume, and especially more than 0% by volume to less than 30% by volume.

When the fluorine gas concentration is in the above range, the excellent etching rate can be attained and the uniformity of cleaning is good even in the conditions that the total gas flow rate is about 1000 sccm and the chamber pressure is about 400 Pa. Further, plasma can be generated stably in the presence of fluorine gas.

As described above, the etching rate has a specific characteristic such that the etching rate and the concentration of fluorine gas are increased almost linearly so that the etching rate is easily predictable from the fluorine gas concentration and it is effective in practical use.

In the case when fluorine gas concentration is limited to be not more than 50% by volume in transportation, etc., the concentration of fluorine gas for submitting to plasma treatment is preferably more than 20% by volume, more preferably more than 30% by volume. Particularly, it is preferably not more than 50% by volume, so that the cleaning gas has a practicability maintainable etching rate and also, as a cleaning gas, excellent transportation property and storage stability, and simple handling. Furthermore, as described above, although this concentration range is a relatively low concentration range, the uniformity of cleaning is not deteriorated even if the chamber pressure is increased in order to increase the etching rate in this concentration range.

Further, even if the concentration of fluorine gas for submitting to plasma treatment is in a low range of 5 to 20% by volume, the uniformity of cleaning is not deteriorated by increasing the chamber pressure in order to increase the etching rate.

The gas substantially incapable of reacting with fluorine in plasma is preferably at least one selected from the group of nitrogen, oxygen, carbon dioxide, $N_2O$, dried air, argon, helium and neon. Among them, it is more preferably at least one selected from the group of oxygen, carbon dioxide and dried air.

The fluorine gas introduced in plasma generates fluorine radicals. Using the gas substantially incapable of reacting with the fluorine radicals, fluorine molecules, fluorine ions etc., the by-product generation can be depressed and the cleaning can be conducted efficiently.

Further, using oxygen, carbon dioxide and dried air, fluorine radicals can be generated stably at low cost.

When the cleaning is conducted using the plasma cleaning gas according to the second invention, the chamber pressure is preferably from 50 Pa to 1000 Pa, more preferably 150 Pa to 1000 Pa. The fluorine gas flow rate is preferably from 50 sccm to 1000 sccm, more preferably 150 sccm to 1000 sccm.

When the chamber pressure and the fluorine gas flow rate are in the above ranges, the excellent etching rate can be attained and also the stabilization of plasma generation and the uniformity of cleaning can be kept excellent.

In the case of using the plasma cleaning gas for CVD chambers according to the second invention, the plasma generation from fluorine gas by electric discharge may be conducted in a remote chamber or by introducing fluorine gas into a plasma CVD apparatus and generating plasma from fluorine gas in a process chamber of the CVD apparatus, without using the remote chamber.

Of these, it is desirable to generate plasma from fluorine gas in the process chamber of the plasma CVD apparatus.

When plasma is generated from fluorine gas in the process chamber, the cleaning treatment of deposits in the CVD chamber can be conducted efficiently for a short time, and also plasma can be stably generated similar to the first invention. Further, the apparatus can be compacted so that it is practical as compared with the plasma generation in the remote chamber.

EXAMPLES

The present invention will be described in more detail with reference to the following non-limiting examples hereinafter.

In the present examples, as one of the properties of the cleaning gas, the cleaning rate for deposits, which should be removed was unequivocally evaluated by the etching rate of a $SiO_2$ thin film on a wafer.

The method of measuring the etching rates of fluorine gas and diluted fluorine gas is shown below. A Si wafer previously deposited $SiO_2$ film thereon having a thickness of about 11000 Å by the plasma CVD method was used as a sample and a parallel plate plasma enhanced CVD apparatus was used. In the conditions as described in Examples, the wafer as a sample was placed on a lower electrode of the parallel plate electrodes and etched. The etching rate was determined by accurately measuring the film thickness on nine fixed points of the sample before and after the etching with a spectroscopic reflectmeter film thickness measuring instrument and measuring the decrease in the film thickness.

The uniformity of cleaning was determined from the maximum value and the minimum value of the etching rates on the nine fixed points with the following formula.

[maximum value−minimum value)/(maximum value+minimum value)]×100(%)

Examples 1 to 17 and Comparative Examples 1 to 16

Figure 1:
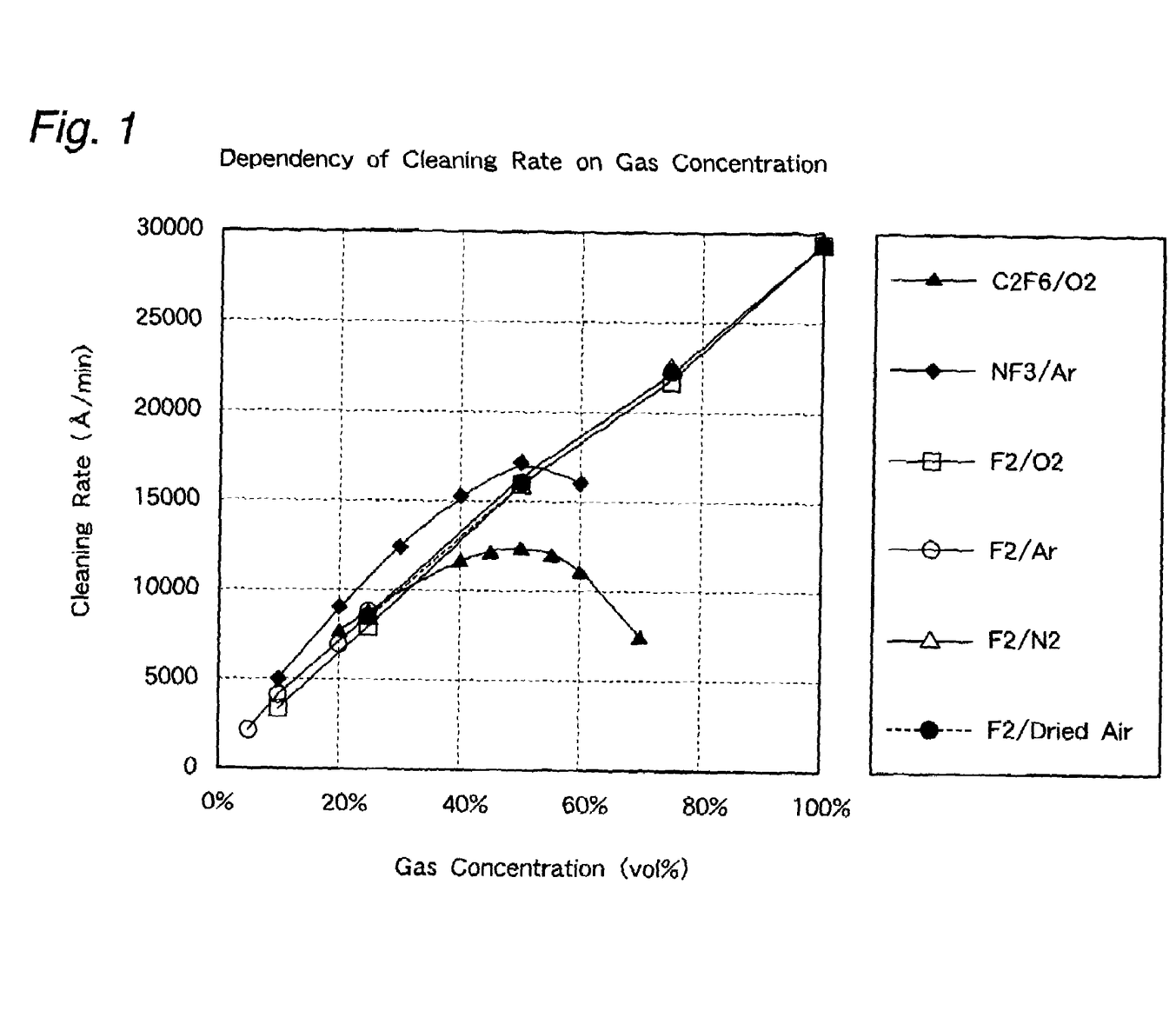
FIG. 1 is a graph showing a relation between a gas concentration and an etching rate concerning the results of Examples 1 to 17 and Comparative Examples 1 to 13.

The dependency of the etching rate on the gas kind and the gas concentration was examined using $F_2$, $C_2F_6$ and $NF_3$ as a cleaning gas and the gases shown in the tables as a dilution gas in the following conditions. The results are shown in Tables 1 to 7. Further, the results are shown in FIG. 1.

| | |
|---|---|
| Total gas flow rate: | 300 sccm |
| Chamber pressure: | 250 Pa |
| Electrode temperature: | 300° C. |
| RF electric power: | 750 W |
| Distance between electrodes: | 50 mm |
| Electric discharge time: | 30 sec |

TABLE 1

|  | Ex. 1 | Ex. 2 | Ex. 3 | Ex. 4 | Ex. 5 |
|---|---|---|---|---|---|
| Cleaning gas composition |  |  |  |  |  |
| $F_2$ amount (mol %) | 10 | 25 | 50 | 75 | 100 |
| $O_2$ amount (mol %) | 90 | 75 | 50 | 25 | 0 |
| Ar amount (mol %) | — | — | — | — | — |
| $N_2$ amount (mol %) | — | — | — | — | — |
| Total gas amount (mol %) | 100 | 100 | 100 | 100 | 100 |
| Etching rate (Å/min) | 3460 | 8190 | 15960 | 21800 | 29420 |
| Uniformity of cleaning (%) | 3 | 3.2 | 4 | 3.9 | 4.1 |

TABLE 2

|  | Ex. 6 | Ex. 7 | Ex. 8 | Ex. 9 | Ex. 10 | Ex. 11 |
|---|---|---|---|---|---|---|
| Cleaning gas composition |  |  |  |  |  |  |
| $F_2$ amount (mol %) | 5 | 10 | 20 | 25 | 50 | 75 |
| $O_2$ amount (mol %) | — | — | — | — | — | — |
| Ar amount (mol %) | 95 | 90 | 80 | 75 | 50 | 25 |
| $N_2$ amount (mol %) | — | — | — | — | — | — |
| Total gas amount (mol %) | 100 | 100 | 100 | 100 | 100 | 100 |
| Etching rate (Å/min) | 2190 | 4230 | 7090 | 8800 | 16440 | 22240 |
| Uniformity of cleaning (%) | 4.2 | 3.6 | 3.3 | 3.9 | 3.4 | 4.5 |

TABLE 3

|  | Ex. 12 | Ex. 13 | Ex. 14 |
|---|---|---|---|
| Cleaning gas composition |  |  |  |
| $F_2$ amount (mol %) | 25 | 50 | 75 |
| $O_2$ amount (mol %) | — | — | — |
| Ar amount (mol %) | — | — | — |
| $N_2$ amount mol % | 75 | 50 | 25 |
| Total gas amount (mol %) | 100 | 100 | 100 |
| Etching rate (Å/min) | 8570 | 16230 | 22450 |
| Uniformity of cleaning (%) | 3.2 | 6.2 | 4.2 |

TABLE 4

|  | Dried air | | |
|---|---|---|---|
|  | Ex. 15 | Ex. 16 | Ex. 17 |
| Cleaning gas composition |  |  |  |
| $F_2$ amount (mol %) | 25 | 50 | 75 |
| $O_2$ amount (mol %) | 15 | 10 | 5 |
| Ar amount (mol %) | — | — | — |
| $N_2$ amount (mol %) | 60 | 40 | 20 |
| Total gas amount (mol %) | 100 | 100 | 100 |
| Etching rate (Å/min) | 8490 | 16180 | 22320 |
| Uniformity of cleaning (%) | 3.2 | 4.3 | 4 |

TABLE 5

|  | Comparative Example | | | | | | |
|---|---|---|---|---|---|---|---|
|  | 1 | 2 | 3 | 4 | 5 | 6 | 7 |
| Cleaning gas composition |  |  |  |  |  |  |  |
| $C_2F_6$ amount (mol %) | 20 | 40 | 45 | 50 | 55 | 60 | 70 |
| $O_2$ amount (mol %) | 80 | 60 | 55 | 50 | 45 | 40 | 30 |
| $NF_3$ amount (mol %) | — | — | — | — | — | — | — |
| Ar amount (mol %) | — | — | — | — | — | — | — |
| Total gas amount (mol %) | 100 | 100 | 100 | 100 | 100 | 100 | 100 |
| Etching rate (Å/min) | 7810 | 11810 | 12270 | 12410 | 12140 | 11140 | 7590 |
| Uniformity of cleaning (%) | 4.7 | 4.3 | 4 | 3.5 | 4 | 3.1 | 1.9 |

TABLE 6

|  | Comparative Example | | | | | |
| --- | --- | --- | --- | --- | --- | --- |
|  | 8 | 9 | 10 | 11 | 12 | 13 |
| Cleaning gas composition | | | | | | |
| $C_2F_6$ amount (mol %) | — | — | — | — | — | — |
| $O_2$ amount (mol %) | — | — | — | — | — | — |
| $NF_3$ amount (mol %) | 10 | 20 | 30 | 40 | 50 | 60 |
| Ar amount (mol %) | 90 | 80 | 70 | 60 | 50 | 40 |
| Total gas amount (mol %) | 100 | 100 | 100 | 100 | 100 | 100 |
| Etching rate (Å/min) | 5070 | 9080 | 12510 | 15310 | 17180 | 16080 |
| Uniformity of cleaning (%) | 3.3 | 3.4 | 3.4 | 4.1 | 24 | 36 |

TABLE 7

|  | Comparative Example | | |
| --- | --- | --- | --- |
|  | 14 | 15 | 16 |
| Cleaning gas composition | | | |
| $C_2F_6$ amount (mol %) | — | — | — |
| $O_2$ amount (mol %) | — | — | — |
| $NF_3$ amount (mol %) | 10 | 30 | 40 |
| $N_2$ amount (mol %) | 90 | 70 | 60 |
| Total gas amount (mol %) | 100 | 100 | 100 |
| Etching rate (Å/min) | 4872 | 12298 | 14316 |
| Uniformity of cleaning (%) | 3.2 | 5.4 | 31.5 |

As is clear from the results, fluorine gas in any concentration until 100% had almost no influence on the uniformity of etching independent on the kind of the added gas.

On the contrary, with respect to $C_2F_6$, in a high $C_2F_6$ concentration, the uniformity of cleaning was not deteriorated, however, the etching rate was largely lowered.

With regard to $NF_3$, in the case that the added gas was argon, when the $NF_3$ concentration was not less than 50%, the uniformity of cleaning was largely deteriorated and when the $NF_3$ concentration was 60%, the lowering of the etching rate was observed. In the case that the added gas was nitrogen, when the $NF_3$ concentration was 40%, the uniformity of cleaning was largely deteriorated. It is presumed that the deterioration shows an indication such that plasma generated is biased and thereby plasma is not generated stably.

Examples 18 to 37

The dependency of the etching rate on the gas flow rate and the chamber pressure was examined by using $F_2$ as a cleaning gas and Ar as a dilution gas in a low $F_2$ concentration of 5 to 20% by volume in the conditions as shown in Tables 8 to 11. The results are shown in Tables 8 to 11.

| Electrode temperature: | 300° C. |
| --- | --- |
| RF electric power: | 750 W |
| Distance between electrodes: | 50 mm |
| Electric discharge time: | 30 sec |

TABLE 8

|  | Ex 18 | Ex 19 | Ex 20 | Ex. 21 |
| --- | --- | --- | --- | --- |
| Total gas flow rate (sccm) | 300 | 300 | 300 | 300 |
| Chamber pressure (Pa) | 250 | 250 | 250 | 150 |
| Cleaning gas composition | | | | |
| $F_2$ amount (mol %) | 5 | 10 | 20 | 5 |
| Ar amount (mol %) | 95 | 90 | 80 | 95 |
| Total gas amount (mol %) | 100 | 100 | 100 | 100 |
| Etching rate (Å/min) | 2192 | 4234 | 7089 | 2731 |
| Uniformity of cleaning (%) | 4.2 | 3.6 | 3.3 | 2.9 |

TABLE 9

|  | Ex 22 | Ex 23 | Ex 24 | Ex 25 | Ex 26 |
| --- | --- | --- | --- | --- | --- |
| Total gas flow rate (sccm) | 500 | 500 | 500 | 500 | 500 |
| Chamber pressure (Pa) | 250 | 250 | 250 | 150 | 400 |
| Cleaning gas composition | | | | | |
| $F_2$ amount (mol %) | 5 | 10 | 20 | 5 | 5 |
| Ar amount (mol %) | 95 | 90 | 80 | 95 | 95 |
| Total gas amount (mol %) | 100 | 100 | 100 | 100 | 100 |
| Etching rate (Å/min) | 2543 | 4801 | 8473 | 3324 | 6297 |
| Uniformity of cleaning (%) | 3.8 | 3.4 | 3.5 | 2.6 | 2.6 |

TABLE 10

|  | Ex 27 | Ex 28 | Ex 29 | Ex 30 | Ex 31 |
| --- | --- | --- | --- | --- | --- |
| Total gas flow rate (sccm) | 700 | 700 | 700 | 700 | 700 |
| Chamber pressure (Pa) | 250 | 250 | 250 | 150 | 400 |
| Cleaning gas composition | | | | | |
| $F_2$ amount (mol %) | 5 | 10 | 20 | 5 | 5 |
| Ar amount (mol %) | 95 | 90 | 80 | 95 | 95 |
| Total gas amount (mol %) | 100 | 100 | 100 | 100 | 100 |
| Etching rate (Å/min) | 2777 | 5241 | 9114 | 3308 | 6923 |
| Uniformity of cleaning (%) | 3.7 | 3.2 | 3.4 | 2.3 | 5.3 |

TABLE 11

|  | Example | | | | | |
| --- | --- | --- | --- | --- | --- | --- |
|  | 32 | 33 | 34 | 35 | 36 | 37 |
| Total gas flow rate (sccm) | 1000 | 1000 | 1000 | 1000 | 1000 | 1000 |
| Chamber pressure (Pa) | 250 | 250 | 250 | 150 | 400 | 400 |

TABLE 11-continued

| | Example | | | | | |
|---|---|---|---|---|---|---|
| | 32 | 33 | 34 | 35 | 36 | 37 |
| Cleaning gas composition | | | | | | |
| $F_2$ amount (mol %) | 5 | 10 | 20 | 5 | 5 | 20 |
| Ar amount (mol %) | 95 | 90 | 80 | 95 | 95 | 80 |
| Total gas amount (mol %) | 100 | 100 | 100 | 100 | 100 | 100 |
| Etching rate (Å/min) | 2978 | 5519 | 9893 | 3531 | 7800 | 13552 |
| Uniformity of cleaning (%) | 3.6 | 3.3 | 3.4 | 2.3 | 5.3 | 4.8 |

As is clear from the results, in the case that the cleaning gas having a F2 concentration of 5 to 20% was used, even if the flow rate was increased in the experimental range or the pressure is increased, the uniformity of cleaning proved to be excellent.

Examples 38 to 55

The dependency of the etching rate on the gas flow rate and the chamber pressure was examined by using a cleaning gas having a $F_2$ concentration of 100% by volume in the conditions as shown in Tables 12 to 16. The results are shown in Tables 12 to 16.

| Electrode temperature: | 300° C. |
|---|---|
| RF electric power: | 750 W |
| Distance between electrodes: | 50 mm |
| Electric discharge time: | 30 sec |

TABLE 12

| | Example | |
|---|---|---|
| | 38 | 39 |
| Total gas flow rate (sccm) | 100 | 100 |
| Chamber pressure (Pa) | 50 | 80 |
| Cleaning gas composition $F_2$ amount (mol %) | 100 | 100 |
| Total gas amount (mol %) | 100 | 100 |
| Etching rate (Å/min) | 5119 | 8239 |
| Uniformity of cleaning (%) | 1.6 | 1.5 |

TABLE 13

| | Example | | |
|---|---|---|---|
| | 40 | 41 | 42 |
| Total gas flow rate (sccm) | 150 | 150 | 150 |
| Chamber pressure (Pa) | 50 | 80 | 100 |
| Cleaning gas composition $F_2$ amount (mol %) | 100 | 100 | 100 |
| Total gas amount (mol %) | 100 | 100 | 100 |
| Etching rate (Å/min) | 4664 | 8981 | 10939 |
| Uniformity of cleaning (%) | 1.6 | 0.6 | 2.4 |

TABLE 14

| | Example | | | |
|---|---|---|---|---|
| | 43 | 44 | 45 | 46 |
| Total as flow rate (sccm) | 200 | 200 | 200 | 200 |
| Chamber pressure (Pa) | 50 | 80 | 100 | 150 |
| Cleaning gas composition $F_2$ amount (mol %) | 100 | 100 | 100 | 100 |
| Total gas amount (mol %) | 100 | 100 | 100 | 100 |
| Etching rate (Å/min) | 5144 | 8270 | 11173 | 17812 |
| Uniformity of cleaning (%) | 1.4 | 1.7 | 2.5 | 2.7 |

TABLE 15

| | Example | | | |
|---|---|---|---|---|
| | 47 | 48 | 49 | 50 |
| Total gas flow rate (sccm) | 250 | 250 | 250 | 250 |
| Chamber pressure (Pa) | 50 | 80 | 100 | 200 |
| Cleaning gas composition $F_2$ amount (mol %) | 100 | 100 | 100 | 100 |
| Total gas amount (mol %) | 100 | 100 | 100 | 100 |
| Etching rate (Å/min) | 4468 | 8733 | 12406 | 23590 |
| Uniformity of cleaning (%) | 2 | 1.2 | 1.9 | 3 |

TABLE 16

| | Example | | | | |
|---|---|---|---|---|---|
| | 51 | 52 | 53 | 54 | 55 |
| Total gas flow rate (sccm) | 300 | 300 | 300 | 300 | 300 |
| Chamber pressure (Pa) | 50 | 80 | 100 | 150 | 250 |
| Cleaning gas composition $F_2$ amount (mol %) | 100 | 100 | 100 | 100 | 100 |
| Total gas amount (mol %) | 100 | 100 | 100 | 100 | 100 |
| Etching rate (Å/min) | 5012 | 9235 | 10927 | 18484 | 29416 |
| Uniformity of cleaning (%) | 1.5 | 1.3 | 2.1 | 2.6 | 4.1 |

As is clear from the results, in an $F_2$ concentration of 100%, even if the flow rate was increased in the experimental range, or the pressure is increased, the uniformity of cleaning proved to be excellent.

Comparative Examples 17 to 29 and Comparative Examples 8 to 13 (Shown Again)

With regard to the etching rate and the uniformity of cleaning, the dependency of $NF_3$ on the concentration and the chamber pressure was examined using $NF_3$ as a cleaning gas and Ar as a dilution gas in the conditions as shown in Tables 17 to 20. The results are shown in Tables 17 to 20.

| Total gas flow rate: | 300 sccm |
|---|---|
| Electrode temperature: | 300° C. |
| RF electric power: | 750 W |
| Distance between electrodes: | 50 mm |
| Electric discharge time: | 30 sec |

TABLE 17

| | Comparative Example | | | | |
|---|---|---|---|---|---|
| | 17 | 18 | 19 | 20 | 21 |
| Chamber pressure (Pa) | 100 | 100 | 100 | 100 | 100 |
| Cleaning gas composition | | | | | |
| $NF_3$ amount (mol %) | 40 | 50 | 80 | 90 | 100 |
| Ar amount (mol %) | 60 | 50 | 20 | 10 | 0 |
| Total gas amount (mol %) | 100 | 100 | 100 | 100 | 100 |
| Etching rate (Å/min) | 8430 | 10198 | 12170 | 13082 | 13390 |
| Uniformity of cleaning (%) | 0.8 | 1.6 | 4.1 | 14.2 | 24.8 |

TABLE 18

| | Comparative Example | | | |
|---|---|---|---|---|
| | 22 | 23 | 24 | 25 |
| Chamber pressure (Pa) | 150 | 150 | 150 | 150 |
| Cleaning gas composition | | | | |
| $NF_3$ amount (mol %) | 60 | 70 | 80 | 90 |
| Ar amount (mol %) | 40 | 30 | 20 | 10 |
| Total gas amount (mol %) | 100 | 100 | 100 | 100 |
| Etching rate (Å/min) | 12594 | 13779 | 13574 | 14389 |
| Uniformity of cleaning (%) | 5.7 | 21.1 | 34.6 | 40.9 |

TABLE 19

| | Comparative Example | | | |
|---|---|---|---|---|
| | 26 | 27 | 28 | 29 |
| Chamber pressure (Pa) | 200 | 200 | 200 | 200 |
| Cleaning gas composition | | | | |
| $NF_3$ amount (mol %) | 40 | 50 | 60 | 70 |
| Ar amount (mol %) | 60 | 50 | 40 | 30 |
| Total gas amount (mol %) | 100 | 100 | 100 | 100 |
| Etching rate (Å/min) | 12308 | 14366 | 15214 | 14987 |
| Uniformity of cleaning (%) | 3.4 | 8.2 | 28.4 | 38.2 |

TABLE 20

| | Comparative Example | | | | | |
|---|---|---|---|---|---|---|
| | 8 | 9 | 10 | 11 | 12 | 13 |
| Chamber pressure (Pa) | 250 | 250 | 250 | 250 | 250 | 250 |
| Cleaning gas composition | | | | | | |
| $NF_3$ amount (mol %) | 10 | 20 | 30 | 40 | 50 | 60 |
| Ar amount (mol %) | 90 | 80 | 70 | 60 | 50 | 40 |
| Total gas amount (mol %) | 100 | 100 | 100 | 100 | 100 | 100 |
| Etching rate (Å/min) | 5070 | 9080 | 12510 | 15310 | 17180 | 16080 |
| Uniformity of cleaning (%) | 3.3 | 3.4 | 3.4 | 4.1 | 24 | 36 |

As is clear from the results, in the case that $NF_3$ was used as a cleaning gas, the uniformity of cleaning was largely deteriorated with the increase of the $NF_3$ concentration. Further, the uniformity of cleaning was largely deteriorated with the increase of the chamber pressure.

Examples 34 and 37 (Shown Again) and Comparative Examples 30 and 31

The dependency of the etching rate and that of the uniformity of cleaning on the chamber pressure were examined by using $F_2$ or $NF_3$ as a cleaning gas and Ar as a dilution gas in a concentration of $F_2$ or $NF_3$ of 20% by volume in the conditions as shown in Tables 21 and 22. The results are shown in Tables 21 and 20.

| | |
|---|---|
| Total gas flow rate: | 1000 sccm |
| Electrode temperature: | 300° C. |
| RF electric power: | 750 W |
| Distance between electrodes: | 50 mm |
| Electric discharge time: | 30 sec |

TABLE 21

| | Ex 34 | Ex 37 |
|---|---|---|
| Total gas flow rate (sccm) | 1000 | 1000 |
| Chamber pressure (Pa) | 250 | 400 |
| Cleaning gas composition | | |
| $F_2$ amount (mol %) | 20 | 20 |
| Ar amount (mol %) | 80 | 80 |
| Total gas amount (mol %) | 100 | 100 |
| Etching rate (Å/min) | 9893 | 13552 |
| Uniformity of cleaning (%) | 3.4 | 4.8 |

TABLE 22

| | Comparative | |
|---|---|---|
| | Ex 30 | Ex 31 |
| Total gas flow rate (sccm) | 1000 | 1000 |
| Chamber pressure (Pa) | 250 | 400 |
| Cleaning gas composition | | |
| $NF_3$ amount (mol %) | 20 | 20 |
| Ar amount (mol %) | 80 | 80 |
| Total gas amount (mol %) | 100 | 100 |
| Etching rate (Å/min) | 12260 | 15380 |
| Uniformity of cleaning (%) | 3.7 | 19.2 |

As is clear from the results, in the case that the total gas flow rate is 1000 sccm, when the chamber pressure was changed from 250 Pa to a higher pressure of 400 Pa, the uniformity of cleaning was deteriorated in the use of 20% by volume of $NF_3$, but the good uniformity of cleaning is ensured in the use of 20% by volume of fluorine gas.

INDUSTRIAL APPLICABILITY

In the present invention, because fluorine gas is used as a cleaning gas, silicon-containing deposits after CVD process can be cleaned at a high rate without using $CF_4$, $C_2F_6$, $SF_6$, $NF_3$ etc. which have a high global warming potential, and exhaust gas can be treated with conventional water scrubber. Therefore, the cleaning can be accomplished with exhausting a slight amount of exhaust gases having the greenhouse effect and the global warming effect.

Further, using the mixed gas of fluorine gas and the gas incapable of substantially reacting with fluorine in plasma in specific amounts, plasma can stably be generated even in the conditions that the total gas flow rate is about 1000 sccm and the chamber pressure is about 400 Pa. Additionally, the etching rate is not lowered and the excellent etching rate can be provided. Further, for example, even if the mixed gas has a low concentration of fluorine gas of 5 to 20% by volume, the uniformity of cleaning can be ensured even in the conditions that the total gas flow rate and the chamber pressure are as described above. Further, the mixed gas having a low concentration of fluorine gas is simple in handleability.

Furthermore, when plasma is generated from 100% by volume of fluorine gas by electric discharge and submitted to use as a cleaning gas, the extremely excellent etching rate can be attained, and plasma can stably be generated even in high-pressure conditions and also the uniformity of cleaning can be ensured even in high-pressure conditions. Additionally, the cleaning gas has a fluorine gas concentration of 100% so that the device is not complicated and the cleaning gas is excellent in practicability.

What is claimed is:

1. A process of plasma cleaning for CVD chambers, comprising cleaning silicon-containing deposits on a surface of an inner wall of a CVD chamber and surfaces of members placed inside the CVD chamber by plasma generated from 100% by volume of a fluorine gas by electric discharge, after film forming treatment on a substrate by a plasma CVD apparatus, wherein a chamber pressure in the plasma CVD apparatus is from 150 Pa to 1000 Pa, and a flow rate of the fluorine gas introduced into a plasma generating part is from 150 sccm to less than 1000 sccm during the plasma cleaning.

2. The process of plasma cleaning for CVD chambers according to claim 1, wherein the silicon-containing deposits comprise at least one selected from the group consisting of:

(1) silicon, (2) a compound comprising silicon and at least one of oxygen, nitrogen, fluorine and carbon, and (3) a compound of a high melting point-having metal silicide.

3. The process of plasma cleaning for CVD chambers according to claim 1, wherein a plasma generation from the fluorine gas is conducted by electric discharge in a process chamber of the plasma CVD apparatus, and the fluorine gas is introduced into the process chamber of the plasma CVD apparatus.

4. A process of plasma cleaning for CVD chambers, comprising cleaning silicon-containing deposits on a surface of an inner wall of a CVD chamber and surfaces of members placed inside the CVD chamber by plasma generated from a fluorine gas by electric discharge using a plasma cleaning gas for CVD chambers comprising the fluorine gas capable of generating plasma by electric discharge and a gas substantially incapable of reacting with fluorine in plasma, wherein a concentration of the fluorine gas is more than 20% by volume to less than 100% by volume, a concentration of the gas substantially incapable of reacting with fluorine in plasma is more than 0% by volume to not more than 80% by volume, a total concentration of the fluorine gas and the gas substantially incapable of reacting with fluorine is 100% by volume, after film forming treatment on a substrate by a plasma CVD apparatus, a pressure in the CVD chamber is from 150 Pa to 1000 Pa, and a flow rate of the fluorine gas is from 150 sccm to less than 1000 sccm during the plasma cleaning.

5. The process of plasma cleaning for CVD chambers according to claim 4, wherein a plasma generation from the fluorine gas is conducted by electric discharge in a process chamber of the plasma CVD apparatus, and the fluorine gas is introduced into the process chamber of the CVD apparatus.

6. The process of plasma cleaning for CVD chambers according to claim 2, wherein a plasma generation from the fluorine gas is conducted by electric discharge in a process chamber of the plasma CVD apparatus, and the fluorine gas is introduced into the process chamber of the CVD apparatus.

* * * * *

UNITED STATES PATENT AND TRADEMARK OFFICE
CERTIFICATE OF CORRECTION

PATENT NO. : 7,322,368 B2
APPLICATION NO. : 10/415101
DATED : January 29, 2008
INVENTOR(S) : Akira Sekiya et al.

It is certified that error appears in the above-identified patent and that said Letters Patent is hereby corrected as shown below:

On the title page, Item (73), the Assignee information is missing. Item (73) should read as follows:

Item -- (73) Assignee: Asahi Glass Company, Limited, Tokyo (JP);
Anelva Corporation, Tokyo (JP);
Ulvac, Inc., Chigasaki-shi (JP);
Kanto Denka Kogyo Co., Ltd, Tokyo (JP);
Sanyo Electric Co., Ltd., Moriguchi-shi (JP);
Showa Denko K.K., Tokyo (JP);
Sony Corporation, Tokyo (JP);
Daikin Industries, Ltd., Osaka-shi (JP);
Tokyo Electron Limited, Tokyo (JP);
NEC Electronics Corporation, Kawasaki-shi (JP);
Hitachi Kokusai Electric Inc., Tokyo (JP);
Matsushita Electric Industrial Co., Ltd., Kadoma-shi, (JP);
Renesas Technology Corp., Tokyo (JP);
National Institute of Advanced Industrial Science and Technology, Tokyo (JP) --

Signed and Sealed this

Twenty-seventh Day of May, 2008

JON W. DUDAS
*Director of the United States Patent and Trademark Office*